United States Patent [19]

Nagode

[11] Patent Number: 5,530,922

[45] Date of Patent: *Jun. 25, 1996

[54] POWER DETECTOR WITH MATCHING IMPEDANCE FOR RADIO FREQUENCY SIGNAL AMPLIFIERS

[75] Inventor: Thomas D. Nagode, Chicago, Ill.

[73] Assignee: Motorola, Inc., Schaumburg, Ill.

[*] Notice: The term of this patent shall not extend beyond the expiration date of Pat. No. 5,448,771.

[21] Appl. No.: 149,483

[22] Filed: Nov. 9, 1993

[51] Int. Cl.⁶ .................................................. H01Q 11/12
[52] U.S. Cl. ............................ 455/126; 455/115; 455/127; 333/17.3; 333/32; 333/109; 330/129; 330/279
[58] Field of Search ............................ 455/126, 127, 455/116, 33.1, 89, 115, 129; 379/59; 333/17.1, 17.3, 32, 109, 116; 330/279, 129

[56] References Cited

U.S. PATENT DOCUMENTS

| | | | |
|---|---|---|---|
| 4,523,155 | 6/1985 | Walczak | 330/279 |
| 4,563,775 | 1/1986 | Yokosuka | 455/126 |
| 4,607,323 | 8/1986 | Sokal et al. | 333/32 |
| 5,043,672 | 8/1991 | Youn | 330/129 |
| 5,193,223 | 3/1993 | Walczak | 455/115 |
| 5,212,815 | 5/1993 | Schumacher | 455/126 |
| 5,230,093 | 7/1993 | Rich et al. | 455/126 |
| 5,335,369 | 8/1994 | Aisaka | 455/126 |

*Primary Examiner*—Reinhard J. Eisenzopf
*Assistant Examiner*—Doris To
*Attorney, Agent, or Firm*—Rolland R. Hackbart

[57] ABSTRACT

A transmission line coupler (115) for a transmitter output signal (123) generated by an RF signal amplifier (103) includes a through-path transmission line (201) and a coupled-path transmission line (202) electromagnetically coupled thereto by multiple serpentine-like portions (such as portions 641, 642, 643 and 644 in FIG. 6), which are disposed on opposite sides of the through-path transmission line (201) for enhancing coupling sensitivity and eliminating degradation in the amount of coupling due to variations in the transmission line plating registration. Offset portions (641, 643) on one side of the through-path transmission line (201) provide substantially the same amount of coupling as the offset portions (642, 643) on the other side of the through-path transmission line (201). The transmission line coupler (115) is embedded in the output match of the final amplifier (103) and includes complex impedances (212 and 210, 222) at each port of the coupled-path transmission line (202) for substantially eliminating undesired reflections. The coupled port of the coupled-path transmission line (202) is coupled by an inductor (211) to a hot-carrier diode (206) for enhancing the detection sensitivity thereof.

3 Claims, 3 Drawing Sheets

POWER DETECTOR WITH MATCHING IMPEDANCE FOR RADIO FREQUENCY SIGNAL AMPLIFIERS

BACKGROUND OF THE INVENTION

The present invention is generally related to radio frequency (RF) signal couplers, and more particularly to a power detector with a matching impedance for RF signal amplifiers of cellular telephones.

In conventional cellular telephones, power detectors typically have been implemented by means of diode detectors (see U.S. Pat. Nos. 4,523,155 and 5,193,223). However, the sensitivity of such prior art diode detectors dictates the amount of coupling needed in order to detect low level signals. For example, in order to detect the lower power levels of RF signals produced by RF signal amplifiers of cellular telephones, 15 dB of coupling is needed. A 15 dB coupler typically has an insertion loss of 0.25 dB or more, representing a substantial amount of current drain that reduces battery talk time. For the, foregoing reasons, there is a need for an improved power detector that has enhanced detection sensitivity at low power levels.

DESCRIPTION OF THE PREFERRED EMBODIMENT

Briefly described, the present invention encompasses RF signal detecting circuitry for detecting an RF signal generated by a signal source and producing a detector signal. The RF signal has a pre-selected one of a plurality of power levels. The RF signal detecting circuitry comprises an RF signal detector coupled to the RF signal for generating an RF detect signal having an amplitude related to the amplitude of the RF signal; and a diode detector coupled by a matching impedance to the RF detect signal for rectifying the RF detect signal to produce the detector signal, the matching impedance substantially matching the impedance of the diode detector when the preselected one of the plurality of power levels is less than a predetermined one of the plurality of power levels.

Figure 1:
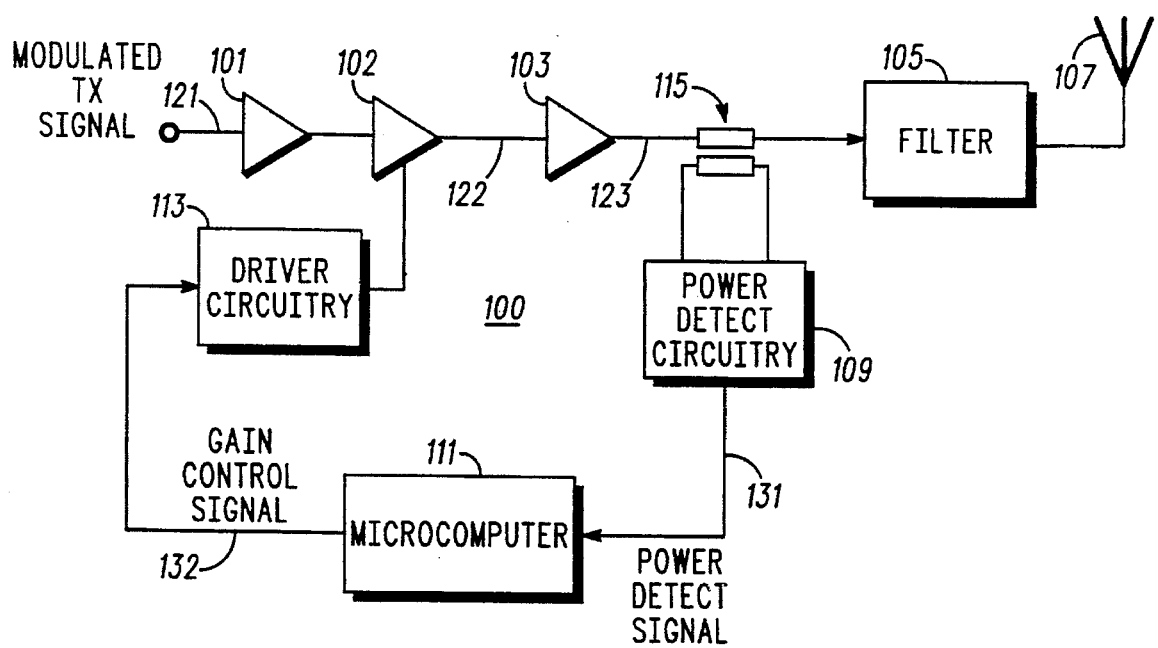
FIG. 1 is a block diagram of RF transmitter circuitry 100, which may advantageously utilize the present invention.
Figure 2:
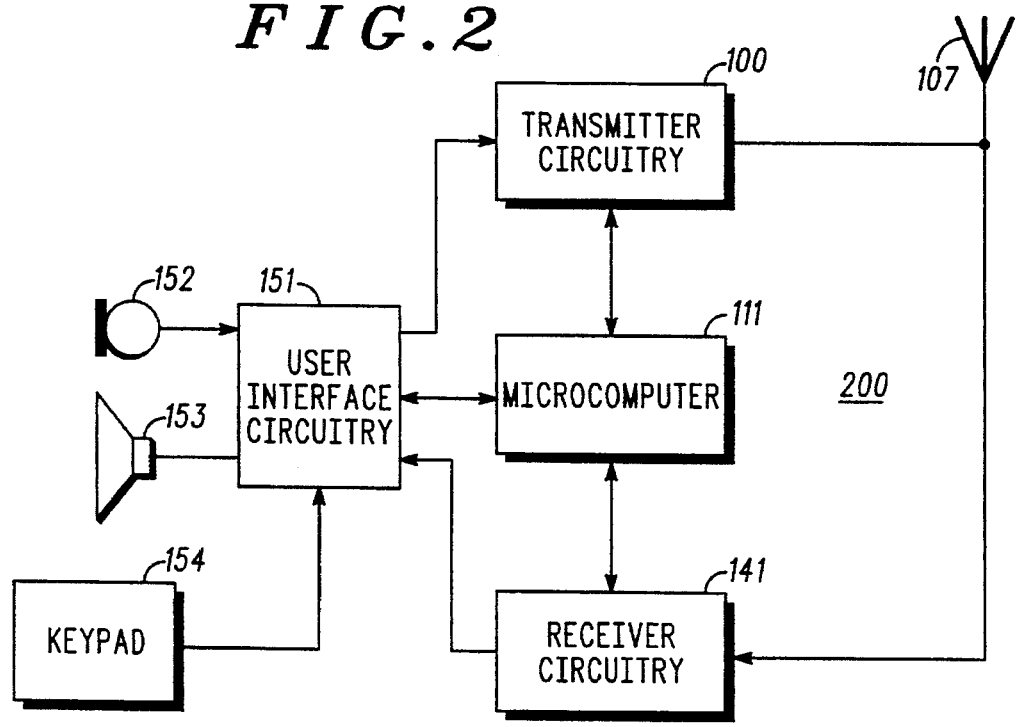
FIG. 2 is a block diagram of a cellular telephone 200 including RF transmitter circuitry 100.

Referring to FIG. 1, there is illustrated a block diagram of unique RF transmitter circuitry 100, which may advantageously utilize the present invention. RF transmitter circuitry 100 is part of cellular telephone 200 in FIG. 2, which also includes receiver circuitry 141, user interface circuitry 151 coupled to a microphone 152, a speaker 153, and a keypad 154, all of which are controlled by microcomputer 111, and which may be elements of any conventional cellular telephone, such as, for example, the cellular telephone shown and described in Motorola instruction manual number 68P81066E40, entitled "DYNATAC Cellular Mobile Telephone 800 MHZ Transceiver," published by and available from Motorola C & E Parts, 1313 East Algonquin Road, Schaumburg, Ill. 60196. The operation and features of such conventional telephone are described in Motorola user's manual number 68P81116E58, entitled "DYNATAC 6800XL Cellular Mobile Telephone USER'S MANUAL," published by and available from Motorola C & E Parts, 1313 East Algonquin Road, Schaumburg, Ill. 60196.

RF transmitter circuitry 100 in FIG. 1 includes cascaded amplifiers 101, 102, and 103 coupled by directional coupler 115 and filter 105 to antenna 107. RF transmitter circuitry 100 together with microcomputer 111 and receiver 141 in FIG. 2 may all be implemented on a multi-layer printed circuit board. Directional coupler 115 is preferably a transmission line directional coupler as described hereinbelow, and is coupled to power detect circuitry 109, which produces power detect signal 131. Microcomputer 111 is responsive to power detect signal 131 for adjusting the magnitude of gain control signal 132 to produce the desired power level of transmitter output signal 123. Gain control signal 132 is coupled to driver circuitry 113 (which may be implemented as shown and described in U.S. Pat. No. 4,523,155, incorporated herein by reference) for adjusting the voltage/current drive to amplifier 102 to correspondingly adjust the amplification gain thereof. In analog cellular telephones, transmitter output signal 123 may be set at one of eight possible power levels in response to control message from the cellular base stations (see U.S. Pat. No. 4,523,155). In digital cellular telephones, transmitter output signal 123 may be set at one of eight possible power levels during an assigned time slot in response to control message from the cellular base stations (see U.S. Pat. No. 5,192,223, incorporated herein by reference). Both analog and digital cellular telephones may advantageously use the present invention.

Figure 3:
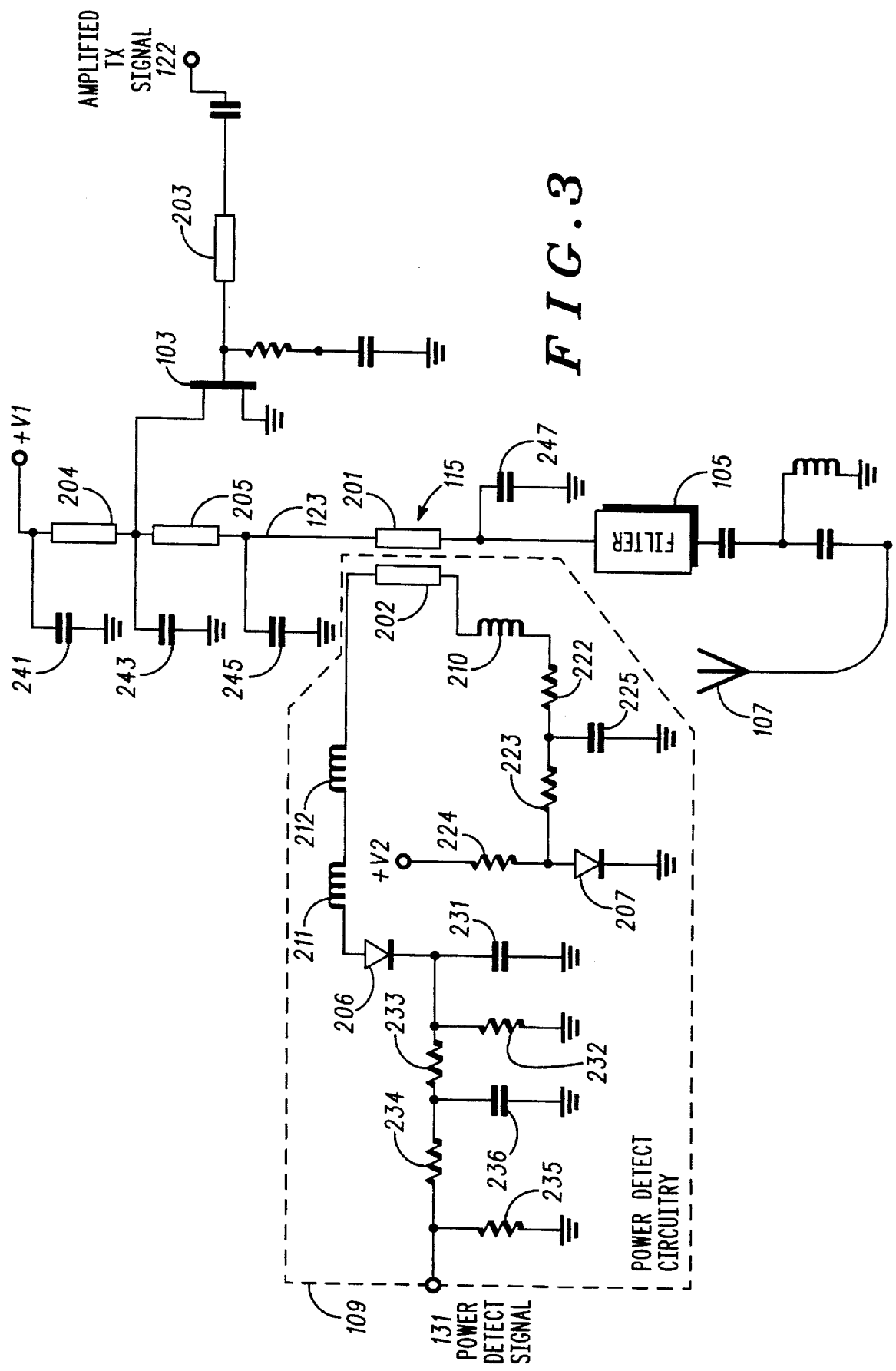
FIG. 3 is a detailed circuit diagram of amplifier 103 and power detect circuitry 109 in FIG. 1.

Referring to FIG. 3, there is illustrated a detailed circuit diagram of final amplifier 103 and power detect circuitry 109 in FIG. 1. Amplifier 103 is preferably a field effect transistor (OKI type KGF1321S FET) which is coupled to amplified TX signal 122 by a capacitor and transmission line 203 and generates the transmitter output signal 123. The output match of amplifier 103 consists of two low pass sections and harmonic matching for the second and third harmonics. The harmonic matching is accomplished by transmission line 204 and capacitor 243. Transmission line 205 and capacitor 245 provide one low pass filter section, and transmission line 201 and capacitor 247 provide the other low pass filter section. Transmission line 201 is also coupled to filter 105, which is in turn coupled by two capacitors and an inductor to antenna 107.

According to a novel feature of transmission line coupler 115, transmission lines 201 and 202 are embedded in the output match of amplifier 103. Since coupler 115 is embedded in the output match of amplifier, 103, the complex impedances at the coupled port and its isolated port of coupled-path transmission line 202 (end connected to inductor 210) need to be carefully selected such that the signal appearing at the coupled port of coupled-path transmission line 202 (end connected to inductor 212) includes signals traveling only in the forward direction and does not include signals traveling in the reverse direction. In conventional directional couplers, the through-path transmission line and the coupled-path transmission line are designed for fifty ohm impedances at all ports. When ideally terminated by fifty ohm impedances, a portion of the RF signal appears at the coupled port of the coupled-path transmission line, and no signal appears at the isolated port of the coupled-path transmission line. Also, no reflections of the RF signal occur since both ports of the through-path transmission line are ideally terminated by fifty ohm impedances. However, since through-path transmission line 201 of embedded coupler 115 is not ideally terminated, but instead coupled between capacitors 245 and 247, several reflections of transmitter output signal 123 occur.

In coupler 115, a desired portion of transmitter output signal 123 is coupled to the coupled port of coupled-path transmission line 202. Transmitter output signal 123 travels down transmission line 201 and a portion is reflected back by capacitor 247. The first reflected transmitter output signal 123 travels back and a portion is reflected back by capacitor 245. An undesired portion of second reflected transmitter output signal 123 is coupled to the coupled port of coupled-path transmission line 202. A portion of first reflected transmitter output signal 123 is also coupled to the isolated port of coupled-path transmission line 202 and travels back to the coupled port of coupled-path transmission line 202. According to a novel feature of transmission line coupler 115, if the proper isolated-port complex impedance terminates the isolated port of coupled-path transmission line 202, the portion of first reflected transmitter output signal 123 that travels back to the coupled port will cancel the coupled portion of second reflected transmitter output signal 123. This proper isolated-port complex impedance includes a real part and an imaginary part, which is implemented in the preferred embodiment by inductor 210 (15 nH) and resistor 222 (39 ohms) coupled in series to the isolated port of coupled-path transmission line 202. By utilizing the proper isolated-port complex impedance to cancel undesired portions of the reflected signals, coupler 115 may be embedded in the output match of amplifier 103, thereby resulting in substantial savings in both circuit board space and the number of components. The proper coupled-port complex impedance further enhances the desired cancellation, and is implemented in the preferred embodiment by inductor 212 (5 nH) coupled in series with inductor 211 (22 nH) and the resistance of diode 206 to the coupled port of coupled-path transmission line 202.

Transmission line 201 provides a through-path for transmitter output signal 123. Coupled-path transmission line 202 is electromagnetically coupled to transmission line 201 for generating an RF detect signal having an amplitude related to the amplitude of transmitter output signal 123. The RF detect signal from transmission line 202 is coupled by inductors 212 and 211 to diode 206, which together with capacitor 231 half-wave rectifies it to generate a DC voltage proportional thereto that is stored on capacitor 231.

The DC voltage stored on capacitor 231 is coupled by resistors 232–235 and capacitor 236 to provide power detect signal 131. Resistor 224 and diode 207 generate a bias voltage from voltage V2 which is coupled by resistors 223 and 222 and inductor 210 to transmission line 202 for biasing diode 206 via inductors 212 and 211. Diodes 207 and 206 are preferably hot carrier diodes having substantially the same electrical characteristics, such as, for example, Motorola type MMBD770T1 diodes. Diode 207 temperature compensates diode 206 so that power detect signal 131 does not vary with changes in temperature.

According to a novel feature of the present invention, an impedance implemented as inductor 211 (22 nH) is coupled to diode 206 for matching the inherent diode resistance and capacitance (1.5 pF), thereby enhancing the sensitivity of power detect circuitry 109 by as much as a factor of two. Although implemented with inductor 211, the matching impedance may also be implemented by corresponding capacitive circuitry. The matching impedance maximizes power transfer to diode 206 and is preferably optimized for operation at the low power levels (e.g., at power levels below a predetermined one of the eight possible power levels), where sensitivity is most important. Since power detect circuitry 109 is more sensitive, less signal is needed for detection and a coupler 115 with 20 dB of coupling can be used instead of 15 dB of coupling used in detector circuits without inductor 211. Coupler 115 with 20 dB of coupling reduces the insertion loss by approximately 0.1 dB, translating into a current drain savings of approximately 8 mA, thereby substantially extending the battery talk time.

Figure 4:
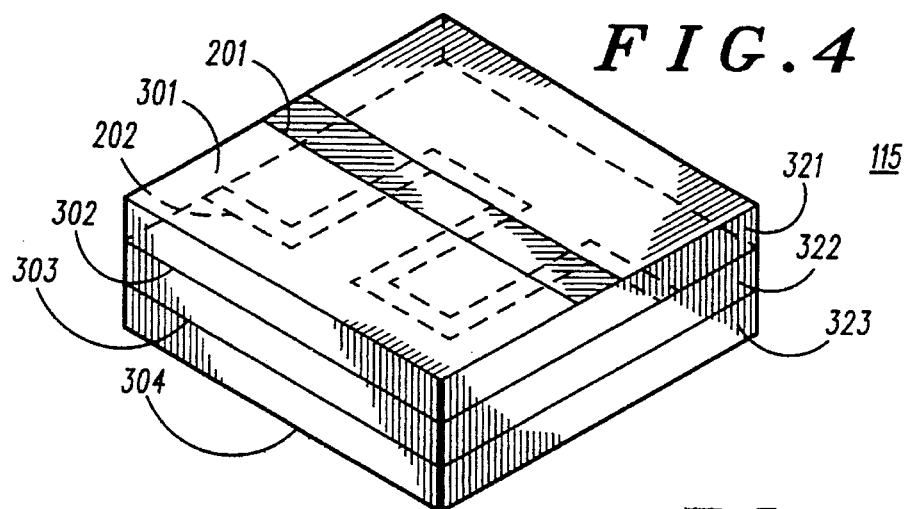
FIG. 4 is a section of a circuit board of the transmitter circuitry in FIG. 1, showing transmission line coupler 115.

Referring to FIG. 4, there is illustrated a section of a circuit board of the transmitter circuitry 100 in FIG. 1, showing transmission line coupler 115. Transmitter circuitry 100 is implemented on a multi-layer circuit board or substrate having three substrate layers, 321, 322 and 323, which, in the preferred embodiment, are comprised of FR-4 fiberglass material having a dielectric constant of 4.66. The substrate material may also be any other suitable material, such as, for example, alumina, duroid, and quartz. Layer 321 includes forward-path transmission line 201 comprised of conductive material plated on its top surface 301, and coupled-path transmission line 202 comprised of conductive material plated on its bottom surface 302. Other circuitry plating (not shown) may be included on other parts of the top and bottom surfaces 301 and 302 of layer 321 of the circuit board. Layer 322 is an intermediate layer that does not have any circuitry plating. Layer 323 has ground plating on its top surface 303 providing a ground plane for transmission lines 201 and 202, and has other circuitry plating (not shown) on its bottom surface 304. Layers 321, 322 and 323 are plated with the corresponding circuitry and bonded together by lamination processes or other suitable processes to form circuit board.

Figure 5:
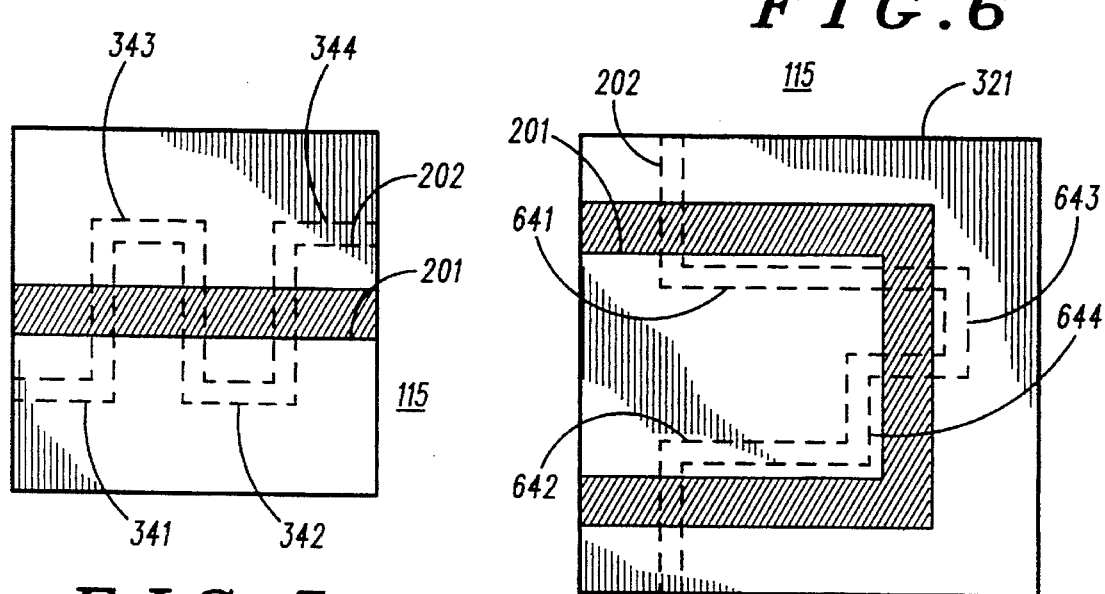
FIG. 5 is a top view of the top layer 321 of the circuit board section in FIG. 4, showing an embodiment of transmission lines 201 and 202 of transmission line coupler 115.

Referring to FIG. 5, there is illustrated a top view of the top layer 321 of the circuit board section in FIG. 4, showing an embodiment of transmission lines 201 and 202 of transmission line coupler 115. According to a novel feature of transmission line coupler 115, transmission line 202 is formed in a serpentine-like manner such that portions 341, 342 and portions 343, 344 are on opposite sides of transmission line 201 when viewed from the top, as in FIG. 5.

Transmission line coupler 115 is preferably sensitive enough to detect low signal levels of transmitter output signal 123, and also relatively low loss to avoid unnecessary attenuation of transmitter output signal 123 and corresponding unnecessary current drain from the battery. By utilizing the transmission line coupler 115, electromagnetic coupling of 20 dB may be achieved in the 825 mHz to 925 mHz frequency band with an insertion loss of less than 0.15 dB.

The amount of electromagnetic coupling between transmission line 201 and transmission line 202 is dependent on a number of factors, including the width of transmission line 202, the thickness of layer 321, and the distance portions 341, 342, 343 and 344 are offset from, and parallel to the edges of transmission line 201. Portions 341,342, 343 and 344 in FIG. 5 have a width less than the width of transmission line 201, and are offset from the edges of transmission line 201 by substantially the same amount. The length of portions 341 and 342 taken together is substantially the same as the length of portions 343 and 344 taken together. The coupling provided by portions 341 and 342 taken together is substantially equal to the coupling provided by portions 343 and 344 taken together. Electromagnetic coupling between transmission line 201 and transmission line 202 is at a maximum between transmission line 201 and portions 341, 342, 343 and 344, and is minimal between transmission line 201 and the perpendicular portions crossing under transmission line 201. As a result, small variations in the registration between the circuitry plating on the top surface 301 and circuitry plating on the bottom surface 302 of layer 321 do not degrade overall electromagnetic coupling between transmission line 201 and transmission line 202, since coupling for portions 341,342 increase when coupling for portions 343, 343 decrease, and vice versa. Many other configurations and shapes of transmission line 202 are possible including sawtooth, semi-circular, and elliptical configurations, as well as the configurations in FIG. 6 and FIG. 7 described herein below.

Figure 6:
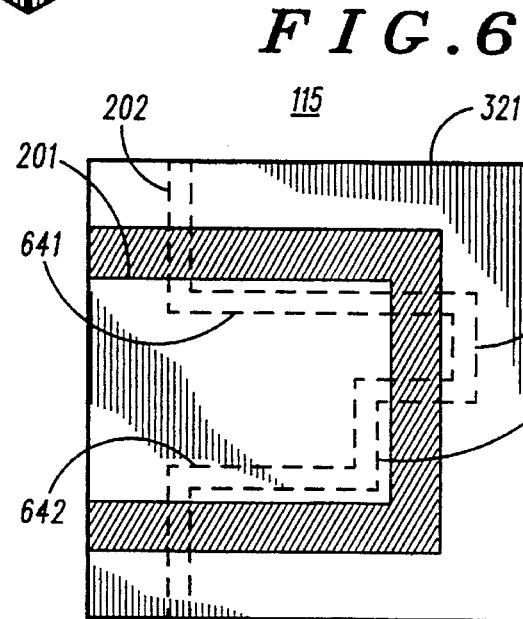
FIG. 6 is a top view of the top layer 321 of the circuit board section in FIG. 4, showing the preferred embodiment of transmission lines 201 and 202 of transmission line coupler 115.

Referring to FIG. 6, there is illustrated a top view of the top layer 321 of the circuit board section in FIG. 4, showing the preferred embodiment of transmission lines 201 and 202 of transmission line coupler 115. Transmission line 201 is U-shaped, and transmission line 202 includes portions 641 and 642 that electromagnetically couple to the parallel sides of U-shaped transmission line 201, and portions 643 and 644 that couple to the middle side of U-shaped transmission line 201. Portions 641,642, 643 and 644 are spaced approximately 0.004 inches from transmission line 201. Portions 641 and 642 are substantially the same length, and portions 643 and 644 are substantially the same length. The total length of portions 641, 642, 643 and 644 taken together is approximately 0.4 inches. The coupling provided by portion 641 is substantially equal to the coupling provided by portion 642, and the coupling provided by portion 643 is substantially equal to the coupling provided by portion 644. Portions 641 and 644 provide at least 23 dB of coupling, and portions 642 and 643 provide at least 23 dB of coupling, to produce electromagnetic coupling of at least 20 dB in the 825 mHz to 925 mHz frequency band with an insertion loss of less than 0.15 dB. In this embodiment in FIG. 6, small variations in the registration between the circuitry plating on the top surface 301 and circuitry plating on the bottom surface 302 of layer 321 may occur in both the X and Y directions without degrading overall coupling between transmission line 201 and transmission line 202.

Figure 7:
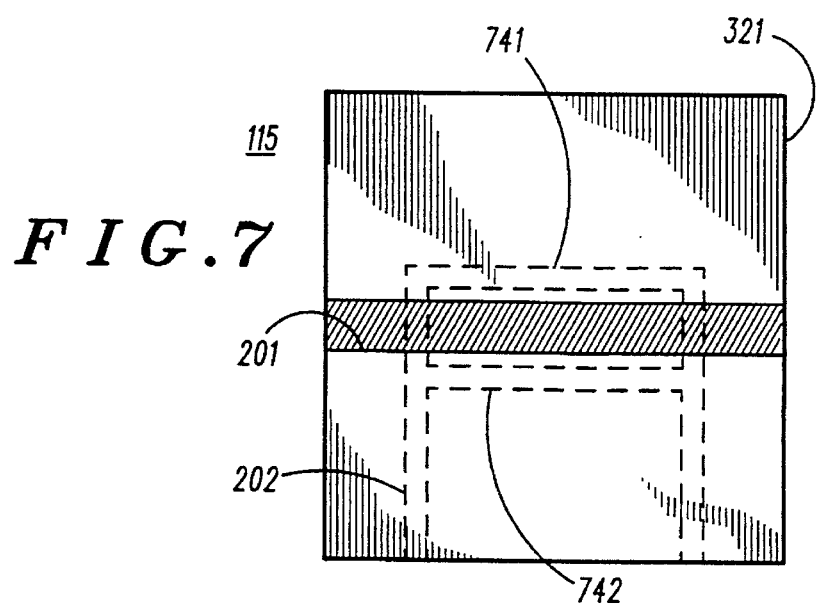
FIG. 7 is a top view of the top layer 321 of the circuit board section in FIG. 4, showing an alternate embodiment of transmission lines 201 and 202 of transmission line coupler 115.

Referring to FIG. 7, there is illustrated a top view of the top layer 321 of the circuit board section in FIG. 4, showing an alternate embodiment of transmission lines 201 and 202 of transmission line coupler 115. Transmission line 202 includes parallel portions 741 and 742 that are parallel to, and electromagnetically couple to transmission line 201. Portions 741 and 742 are substantially the same length, and the coupling provided by portions 741 and 742 is substantially equal.

In summary, power detecting circuitry 109 includes hot carrier diode 206 coupled in series with matching impedance inductor 211 for enhancing detector sensitivity. Matching impedance inductor 211 maximizes power transfer to diode 206 so that less RF signal is needed for detection. As a result, a 20 dB coupler 115 can be used, reducing the insertion loss by approximately 0.1 dB and current drain by approximately 8 mA, thereby extending battery talk time.

I claim:

1. Radio frequency (RF) signal detecting circuitry for detecting an RF signal generated by a signal source and producing a detector signal, the RF signal having a pre-selected one of a plurality of power levels, said RF signal detecting circuitry comprising:

an RF signal detector coupled to the RF signal for generating an RF detect signal having an amplitude related to the RF signal; and a diode detector having an impedance with a capacitive portion and being coupled to the RF detect signal for rectifying the RF detect signal to produce the detector signal; and an inductor coupled in series between the diode detector and the RF signal detector and being pre-selected to substantially match the capacitive portion of the impedance of the diode detector when the pre-selected one of the plurality of power levels is less than a predetermined one of the plurality of power levels for maximizing power transfer to the diode detector.

2. Transmitting circuitry for amplifying a radio frequency (RF) signal and producing a transmitter output signal at a pre-selected one of a plurality of power levels, said transmitting circuitry comprising:

a signal source for generating the RF signal;

an amplifier coupled to the RF signal and a gain control signal for amplifying by a variable gain the RF signal to produce the transmitter output signal, the variable gain having a magnitude related to the gain control signal;

transmission line coupler coupled to the amplifier for generating an RF detect signal having an amplitude related to the transmitter output signal, said transmission line coupler further comprising:

a substrate having top and bottom surfaces and a predetermined dielectric constant;

a through-path transmission line having a predetermined shape and being disposed on the top surface of the substrate, the through-path transmission line coupled to the transmitter output signal; and a coupled-path transmission line being disposed on the bottom surface of the substrate and electromagnetically coupled to the through-path transmission line for generating the RF detect signal having said amplitude related to the transmitter output signal;

a diode detector having an impedance with a capacitive portion and being coupled to the RF detect signal for rectifying the RF detect signal to produce a detector signal;

an inductor coupled in series between the diode detector and the coupled-path transmission line and being pre-selected to substantially match the capacitive portion of the impedance of the diode detector when the pre-selected one of the plurality of power levels is less than a predetermined one of the plurality of power levels for maximizing power transfer to the diode detector; and control circuitry coupled to the detector signal for adjusting the magnitude of the gain control signal to maintain the transmitter output signal at the pre-selected one of the plurality of power levels.

3. In a cellular telephone, transmitting circuitry for amplifying a radio frequency (RF) signal and producing a transmitter output signal at a pre-selected one of a plurality of power levels, said transmitting circuitry comprising:

a signal source for generating the RF signal;

an amplifier coupled to the RF signal and a gain control signal for amplifying by a variable gain the RF signal to produce the transmitter output signal, the variable gain having a magnitude related to the gain control signal;

a transmission line coupler coupled to the amplifier for generating an RF detect signal having an amplitude related to the amplitude of the transmitter output signal, said transmission line coupler further comprising:

a substrate having top and bottom surfaces and a predetermined dielectric constant;

a through-path transmission line having a predetermined shape and being disposed on the top surface of the substrate, the through-path transmission line coupled to the transmitter output signal; and a coupled-path transmission line being disposed on the bottom surface of the substrate and electromagnetically coupled to the through-path transmission line for generating the RF detect signal having said amplitude related to the transmitter output signal;

a diode detector having an impedance with a capacitive portion and being coupled to the RF detect signal for rectifying the RF detect signal to produce a detector signal;

an inductor coupled in series between the diode detector and the coupled-path transmission line and being preselected to substantially match the capacitive portion of the impedance of the diode detector when the preselected one of the plurality of power levels is less than a predetermined one of the plurality of power levels for maximizing power transfer to the diode detector;

control circuitry coupled to the detector signal for adjusting the magnitude of the gain control signal to maintain the transmitter output signal at the pre-selected one of the plurality of power levels; and an antenna coupled to said transmission line coupler for radiating the transmitter output signal.

\* \* \* \* \*